US012598710B2

(12) United States Patent
Li et al.

(10) Patent No.: US 12,598,710 B2
(45) Date of Patent: Apr. 7, 2026

(54) TERMINAL DEVICE

(71) Applicant: Honor Device Co., Ltd., Shenzhen (CN)

(72) Inventors: Wei Li, Shenzhen (CN); Zhu Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 512 days.

(21) Appl. No.: 17/802,336

(22) PCT Filed: Jan. 18, 2022

(86) PCT No.: PCT/CN2022/072606

§ 371 (c)(1),
(2) Date: Aug. 25, 2022

(87) PCT Pub. No.: WO2023/273315

PCT Pub. Date: Jan. 5, 2023

(65) Prior Publication Data

US 2024/0130059 A1 Apr. 18, 2024

(30) Foreign Application Priority Data

Jun. 29, 2021 (CN) ......................... 202110726884.9
Jul. 9, 2021 (CN) ......................... 202110777767.5

(51) Int. Cl.
*H05K 5/03* (2006.01)
*H05K 5/02* (2006.01)

(52) U.S. Cl.
CPC ............. *H05K 5/0217* (2013.01); *H05K 5/03* (2013.01)

(58) Field of Classification Search
CPC .............................. H05K 5/0217; H05K 5/03
See application file for complete search history.

(56) References Cited

U.S. PATENT DOCUMENTS

| | | | |
|---|---|---|---|
| 10,219,058 B2 | 2/2019 | Hung et al. | |
| 2020/0252706 A1* | 8/2020 | Yin ........................ | H04M 1/035 |
| 2022/0141323 A1* | 5/2022 | Yuan ..................... | H04M 1/035 |
| | | | 455/575.1 |

FOREIGN PATENT DOCUMENTS

| | | |
|---|---|---|
| CN | 108650345 A | 10/2018 |
| CN | 109327566 A | 2/2019 |
| CN | 111245987 A | 6/2020 |
| CN | 212305405 U | 1/2021 |
| CN | 112968984 A | 6/2021 |
| EP | 4262177 A1 | 10/2023 |
| JP | 2004363717 A | 12/2004 |

* cited by examiner

*Primary Examiner* — Olisa Anwah
(74) *Attorney, Agent, or Firm* — Conley Rose, P.C.

(57) ABSTRACT

A terminal device includes a middle frame, a receiver assembly, and a sealing assembly. The middle frame includes a first surface and a second surface that are arranged opposite to each other. Sound outlet holes are arranged on the middle frame. A first groove is arranged on the first surface, and the first groove is in communication with the sound outlet holes. A first through hole is arranged on a bottom wall of the first groove. The receiver assembly is arranged on the second surface. The receiver assembly is sealedly connected to the middle frame, and corresponds to the first through hole. The sealing assembly is configured to seal the first groove. The first groove and the first through hole form a front sound cavity of the receiver assembly.

18 Claims, 5 Drawing Sheets

10

100

10

107   101   105

A

30

200

10

33

TERMINAL DEVICE

CROSS-REFERENCE TO RELATED APPLICATIONS

This application is a U.S. National Stage of International Application No. PCT/CN2022/072606 filed on Jan. 18, 2022, which claims priority to Chinese Patent application Ser. No. 20/211,0726884.9, filed with the China National Intellectual Property Administration on Jun. 29, 2021, and Chinese Patent application Ser. No. 20/211,0777767.5, filed with the China National Intellectual Property Administration on Jul. 9, 2021, all of which are incorporated herein by reference in their entireties.

TECHNICAL FIELD

Embodiments of this application relate to the field of terminal technologies, and in particular, to a terminal device.

BACKGROUND

Terminal devices developing toward an ultimate screen-to-body ratio. For many terminal devices in the industry, for example, mobile phones, holes are arranged on the top of a middle frame, to form sound outlet holes of a receiver, and the positions of the sound outlet holes of the receiver are changed from the front of the screen to the top of the terminal device, thereby reducing black borders of the screen and obtaining a greater screen ratio. A front sound cavity of the receiver of the terminal device needs to be sealed, to ensure that a sound from the receiver is emitted only from the sound outlet holes. In the existing solution, the receiver is sealedly connected to a support by a sealing member, the support is sealedly connected to the middle frame by another sealing member, a through hole corresponding to the receiver is arranged on the support, and a groove is arranged on a side of the support facing away from the receiver, and the groove is in communication with the through hole and the sound outlet holes respectively, thereby forming the sealed front sound cavity of the receiver. The receiver is mounted on the middle frame with the help of the support, and the groove and the through hole for forming the structure of the front sound cavity are arranged on the support, resulting in high manufacturing and mounting costs of the support.

SUMMARY

In view of this, this application provides a low-cost terminal device in which a structure of a front sound cavity of a receiver is formed.

This application provides a terminal device. The terminal device includes a middle frame, a receiver assembly, and a sealing assembly. The middle frame includes a first surface and a second surface. The first surface and the second surface are arranged opposite to each other. Sound outlet holes are arranged on the middle frame. A first groove is arranged on the first surface of the middle frame. The first groove is in communication with the sound outlet holes. A first through hole is arranged on a bottom wall of the first groove. The receiver assembly is arranged on the second surface of the middle frame. The receiver assembly is sealedly connected to the middle frame, and corresponds to the first through hole. The sealing assembly is configured to seal the first groove.

In the foregoing design, the first groove of the middle frame and the first through hole form a front sound cavity of the receiver assembly. The middle frame is sealedly connected to the receiver assembly, and the sealing assembly seals the first groove, so that the front sound cavity of the receiver assembly is sealed, and a sound from the receiver assembly is emitted only from the sound outlet holes on the middle frame. In this way, the cost of the sealing assembly for sealing the structure of the front sound cavity is low, and the cost of manufacturing the first groove and the first through hole on the middle frame is low.

In a possible design, the receiver assembly includes a receiver and a first sealing member. A second through hole is arranged on the first sealing member. The second through hole is in communication with the first through hole. A second groove is arranged on the second surface. The receiver is arranged in the second groove, and is sealedly connected to a bottom wall of the second groove by the first sealing member.

In the foregoing design, the second groove provides a mounting space for the receiver assembly, and the second through hole communicates the receiver assembly with the first groove and the sound outlet holes.

In a possible design, the sealing assembly includes a cover plate and a second sealing member. The cover plate is arranged in the first groove. The second sealing member is adhered to the middle frame. The second sealing member covers a gap between the cover plate and the middle frame.

In the foregoing design, the cover plate is arranged in the first groove, and a cavity is formed between the cover plate and the bottom wall of the first groove, and the cavity and the first through hole form the front sound cavity of the receiver assembly. The second sealing member covers the gap between the cover plate and the middle frame, so that the front sound cavity is sealed.

In a possible design, a protruding mounting portion is arranged in the first groove. The sealing assembly further includes a third sealing member. The third sealing member is arranged on the mounting portion. The cover plate is arranged on a side of the third sealing member facing away from the mounting portion.

In the foregoing design, the cover plate is fixed in the first groove by the third sealing member, so that the cover plate and the middle frame are preliminarily sealed.

In a possible design, the middle frame further includes a side frame. The side frame surrounds outer sides of the first surface and the second surface, and is connected to the first surface and the second surface respectively. The sound outlet holes are arranged on the side frame. The first groove includes a first groove portion and a second groove portion that are in communication. The first through hole is in communication with the first groove portion. The second groove portion is located on a junction of the first surface and the side frame, and is in communication with the sound outlet holes.

In the foregoing design, the first groove portion is in communication with the first through hole, and the second groove portion is in communication with the sound outlet holes, so that a sound emitted by the receiver assembly is transmitted through the sound outlet holes. The second groove portion provides a demolding space for the sound outlet holes, and does not occupy the mounting space on the second surface.

In a possible design, the first surface and the side frame are connected by a rounded transition surface. The cover plate includes an engagement portion with an arc-shaped structure. The engagement portion is arranged in the second groove portion, so that the engagement portion and a surface of the middle frame coincide on the junction of the side frame and the first surface.

In the foregoing design, the engagement portion with the arc-shaped structure adapts to the manner in which the first surface is connected to the rounded transition surface of the side frame, and the engagement portion and the middle frame coincide on the junction of the side frame and the first surface, so that the second sealing member easily covers the gap between the cover plate and the middle frame.

In a possible design, the cover plate includes a body and an engagement portion. The body is arranged in the first groove portion, and the engagement portion is arranged in the second groove portion, so that the bottom wall of the first groove and the sound outlet holes are located on a same side of the cover plate.

In the foregoing design, the first groove and the sound outlet holes are located on the same side of the cover plate, and the body and the engagement portion communicate the first groove with the sound outlet holes, so that the front sound cavity of the receiver assembly is formed between the cover plate and the bottom wall of the first groove, and the front sound cavity of the receiver assembly is preliminarily enclosed.

In a possible design, arc-shaped grooves are arranged on the engagement portion. The arc-shaped grooves are butted with the sound outlet holes.

In the foregoing design, the arc-shaped grooves ensure that the engagement portion does not block the sound outlet holes, thereby ensuring the sound quality.

In a possible design, protruding support portions are arranged on a side of the engagement portion toward the bottom wall of the first groove. The support portions are in contact with a groove wall of the second groove portion.

In the foregoing design, the support portions are in contact with the groove wall of the second groove portion, which improves the strength of the engagement portion, so that the engagement portion is not easily deformed by collision, and is not easy to block the sound outlet holes.

In a possible design, a third groove is arranged on the bottom wall of the first groove.

In the foregoing design, the third groove increases the space size of the front sound cavity of the receiver assembly, thereby ensuring the sound quality.

BRIEF DESCRIPTION OF DRAWINGS

To describe the technical solutions in the embodiments of this application more clearly, the following briefly describes the drawings required for the embodiments.

LIST OF REFERENCE NUMERALS

Terminal device: 100; middle frame: 10; first surface: 101; second surface: 103; side frame: 105; rounded transition surface: 107; sound outlet hole: 11; first groove: 12; first groove portion: 1201; second groove portion: 1203; bottom wall: 121; mounting portion: 125; third groove: 127; first through hole: 14; second groove: 15; bottom wall: 151; receiver assembly: 20; receiver: 21; first sealing member: 23; second through hole: 231; sealing assembly: 30; cover plate: 33; body: 331; engagement portion: 333; arc-shaped groove: 3331; support portion: 3333; second sealing member: 35; and third sealing member: 37.

DESCRIPTION OF EMBODIMENTS

To further explain technical means and effects adopted in this application to achieve the intended purposes of this application, the following is described with reference to the drawings and implementations. Apparently, the described embodiments are only some embodiments rather than all the embodiments of this application.

Unless otherwise defined, meanings of all technical and scientific terms used in this specification are the same as those usually understood by a person skilled in the art to which this application belongs. In this specification, terms used in the specification of this application are merely intended to describe objectives of the specific embodiments, but are not intended to limit this application.

The embodiments of this application provide a terminal device. The terminal device includes a middle frame, a receiver assembly, and a sealing assembly. The middle frame includes a first surface and a second surface that are arranged opposite to each other. Sound outlet holes are arranged on the middle frame. A first groove is arranged on the first surface of the middle frame. The first groove is in communication with the sound outlet holes. A first through hole is arranged on a bottom wall of the first groove. The receiver assembly is arranged on the second surface of the middle frame. The receiver assembly is sealedly connected to the middle frame, and corresponds to the first through hole. The sealing assembly is configured to seal the first groove.

In the foregoing terminal device, the first groove of the middle frame and the first through hole form a front sound cavity of the receiver assembly. The middle frame is sealedly connected to the receiver assembly, and the sealing assembly seals the first groove, so that the front sound cavity of the receiver assembly is sealed, and a sound from the receiver assembly is emitted only from the sound outlet holes on the middle frame. In this way, the cost of the sealing assembly for sealing the structure of the front sound cavity is low, and the cost of manufacturing the first groove and the first through hole on the middle frame is low.

The following describes some implementations of this application with reference to the drawings. The following embodiments and features in the embodiments may be mutually combined in case that no conflict occurs.

Figure 1:
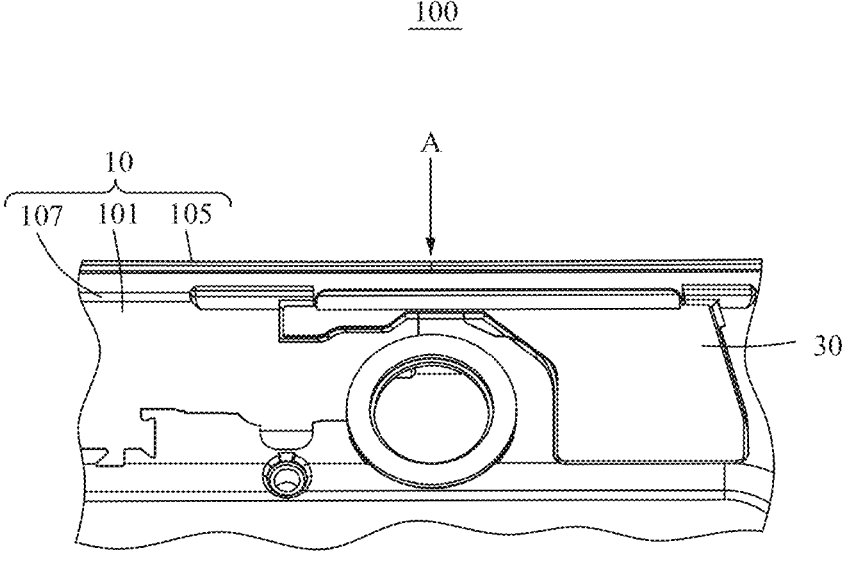
FIG. 1 is a schematic diagram of a terminal device in which a second sealing member is omitted according to an embodiment of this application.
Figure 2:
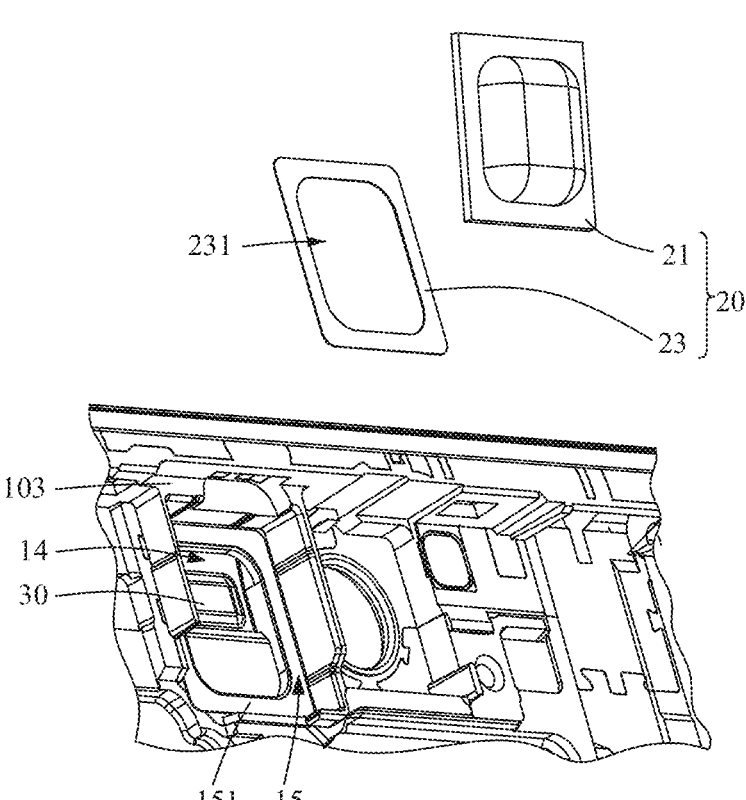
FIG. 2 is a partial schematic diagram of an exploded structure of the terminal device shown in FIG. 1.
Figure 3:
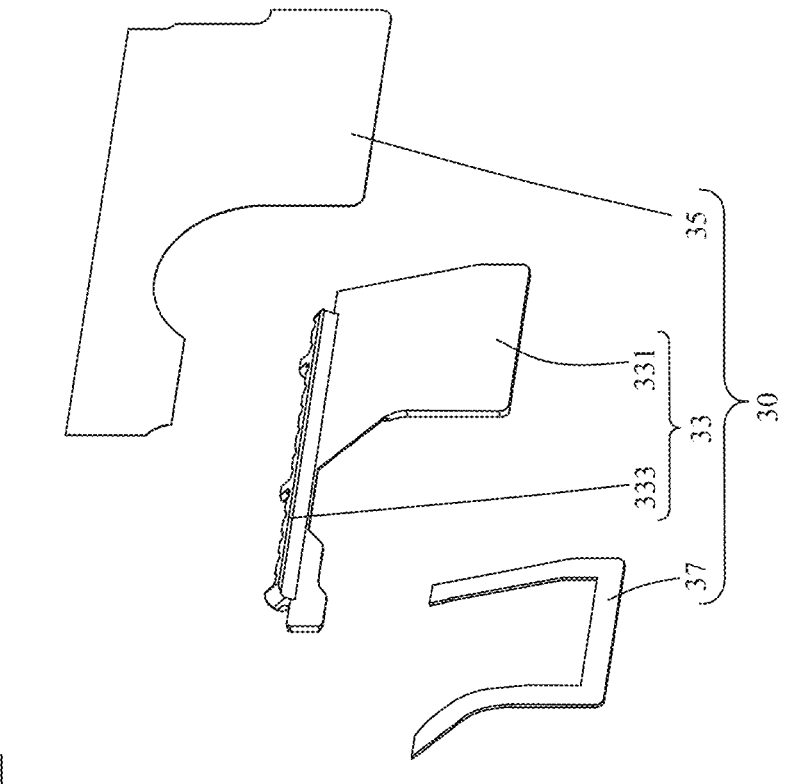
FIG. 3 is a partial schematic diagram of an exploded structure of the terminal device shown in FIG. 1 from another angle of view.
Figure 3:
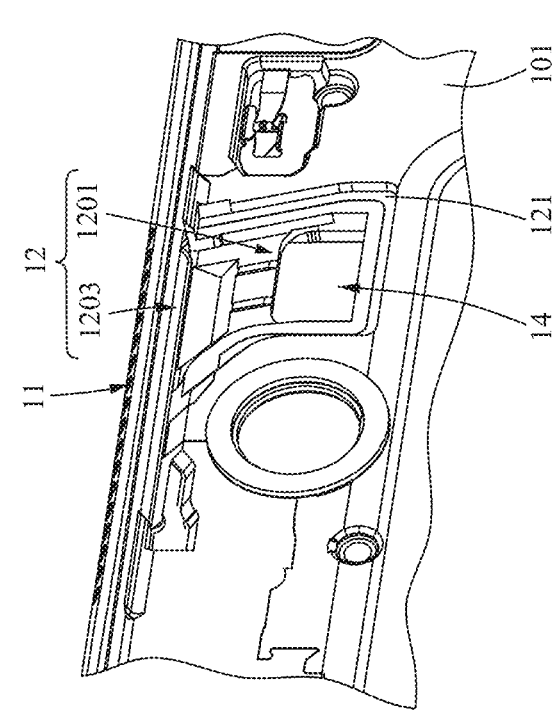
Figure 4:
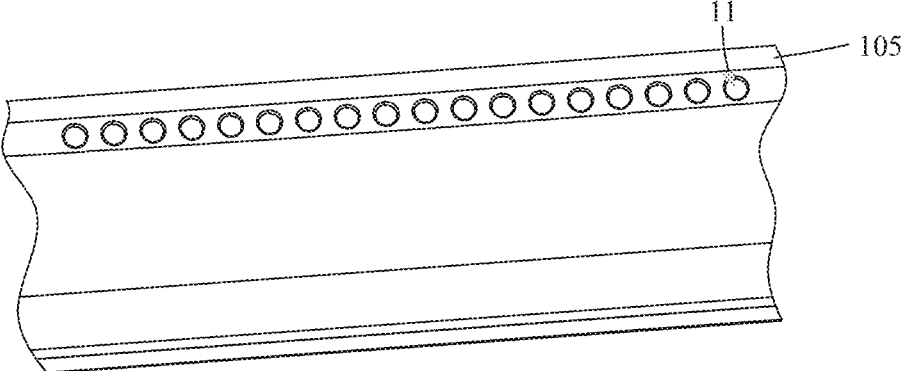
FIG. 4 is a partial schematic diagram of the terminal device shown in FIG. 1 taken along direction A.

Referring to FIG. 1, FIG. 2, and FIG. 3 together, an embodiment of this application provides a terminal device 100. The terminal device 100 is a mobile phone, but is not limited thereto. The terminal device 100 includes a middle frame 10, a receiver assembly 20, and a sealing assembly 30. The receiver assembly 20 and the sealing assembly 30 are arranged on two opposite sides of the middle frame 10 respectively. The middle frame 10 includes a first surface 101 and a second surface 103. The first surface 101 and the second surface 103 are arranged opposite to each other. As shown in FIG. 4, sound outlet holes 11 are arranged on the middle frame 10. The receiver assembly 20 is arranged on the second surface 103 of the middle frame 10, and is sealedly connected to the middle frame 10. A first groove 12 is arranged on the first surface 101 of the middle frame 10. The sealing assembly 30 is configured to seal the first groove 12. The first groove 12 is in communication with the sound outlet holes 11. A first through hole 14 is arranged on a bottom wall 121 of the first groove 12, and the first through hole 14 corresponds to the receiver assembly 20.

The first groove 12 of the middle frame 10 and the first through hole 14 form a front sound cavity of the receiver assembly 20. The middle frame 10 is sealedly connected to the receiver assembly 20, and the sealing assembly 30 seals the first groove 12, so that the front sound cavity of the receiver assembly 20 is sealed, and a sound from the receiver assembly 20 is emitted only from the sound outlet holes 11 on the middle frame 10. In this way, the cost of the sealing assembly 30 for sealing the structure of the front sound cavity is low, and the cost of manufacturing the first groove 12 and the first through hole 14 that form the front sound cavity on the middle frame 10 is low.

The first surface 101 and the second surface 103 may be a flat surface, a curved surface, or a stepped surface, or a surface formed by combining the above different surfaces. The first surface 101 of the middle frame 10 is for mounting the sealing assembly 30, and is further for mounting a screen (not shown in the figures) of the terminal device 100. The second surface 103 is for mounting the receiver assembly 20, and is further for mounting other structural members of the terminal device 100. For example, the other structural members may be a camera and a circuit board (not shown in the figures). The receiver assembly 20 is electrically connected to the circuit board.

In the existing terminal device, a support is arranged on the second surface 103 of the middle frame 10, and groove structures forming a front sound cavity of a receiver are arranged on the support. Due to acoustic requirements, the space size of the front sound cavity of the receiver needs to reach a set value, to ensure stable sound transmission. A space for the front sound cavity to reach the set value needs to be provided on the support, resulting in an increased size of the support. Moreover, a demolding space for the sound outlet holes needs to be provided on a side of the support toward the middle frame 10, which further increases the size of the support. The support occupies a large mounting space on the middle frame 10, which may cause difficulty in the mounting and layout of the structural members of the terminal device on the second surface 103 of the middle frame 10.

In the terminal device 100 provided by this application, the receiver assembly 20 and the sealing assembly 30 are arranged on the two opposite sides of the middle frame 10, and the receiver assembly 20 occupies a small space on the second surface 103 of the middle frame 10. The first groove 12 is arranged on the first surface 101, and the sealing assembly 30 is arranged in the first groove 12. When the sealing assembly 30 is entirely located in the first groove 12, the sealing assembly 30 occupies no space on the first surface 101. When the sealing assembly 30 is partially located in the first groove 12, the sealing assembly 30 occupies a small space on the first surface 101.

The first groove 12 arranged on the first surface 101 is in communication with the sound outlet holes 11, which provides a demolding space for the sound outlet holes 11 and occupies no mounting space on the second surface 103 of the middle frame 10. In this way, the mounting space of the middle frame 10 is improved, so that the middle frame 10 can meet more stacking requirements, for example, can meet stacking mounting requirements of a camera assembly.

Figure 5:
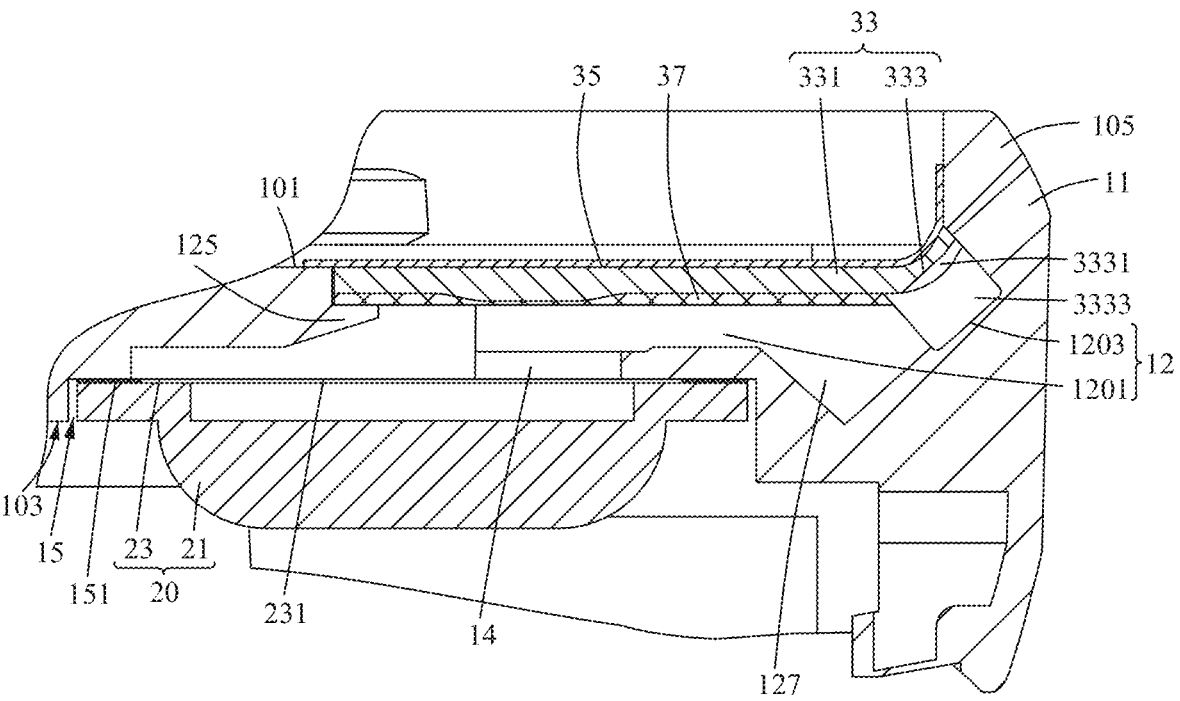
FIG. 5 is a schematic partial cross-sectional view of the terminal device shown in FIG. 1.

Referring to FIG. 2 and FIG. 5, a second groove 15 is arranged on the second surface 103 of the middle frame 10. The receiver assembly 20 is arranged in the second groove 15. The second groove 15 is in communication with the first groove 12 through the first through hole 14. The receiver assembly 20 includes a receiver 21 and a first sealing member 23. A second through hole 231 is arranged on the first sealing member 23. The first sealing member 23 is adhered to a bottom wall 151 of the second groove 15. The receiver 21 is arranged on the first sealing member 23. The receiver 21 is sealedly connected to the middle frame 10 by the first sealing member 23, and is in communication with the first through hole 14 through the second through hole 23. A sound emitted by the receiver 21 is transmitted from the sound outlet holes 11 after passing through the second through hole 231, the second groove 15, the first through hole 14, and the first groove 12.

Referring to FIG. 1 and FIG. 5, a side frame 105 is arranged on the middle frame 10. The side frame 105 is an annular wall structure surrounding outer sides of the first surface 101 and the second surface 103. The side frame 105 is connected to the first surface 101 and the second surface 103. The sound outlet holes 11 are arranged on the side frame 105. The sound outlet holes 11 penetrate through the side frame 105, and are in communication with the first groove 12.

In a possible implementation, the sound outlet hole 11 is a circular hole, and there are a plurality of sound outlet holes 11. As shown in FIG. 4, a plurality of sound outlet holes 11 are arranged on the side frame 105 at intervals.

It may be understood that, in other implementations, there may alternatively be one sound outlet hole 11, and the sound outlet hole 11 may alternatively be a rectangular long hole or of another structure. The quantity and shape of the sound outlet holes 11 may be set according requirements, as long as the sound outlet holes 11 are in communication with the first groove 12 to transmit the sound emitted by the receiver 21.

Referring to FIG. 3 and FIG. 5, the sealing assembly 30 includes a cover plate 33 and a second sealing member 35. The cover plate 33 is arranged in the first groove 12. Specifically, a protruding mounting portion 125 is arranged on the bottom wall 121 of the first groove 12. The mounting portion 125 is located in the first groove 12, and does not protrude from the first surface 101. The cover plate 33 is arranged on the mounting portion 125. The second sealing member 35 is arranged on a side of the cover plate 33 facing away from the mounting portion 125, and is adhered to the middle frame 10. The second sealing member 35 covers a gap between the cover plate 33 and the middle frame 10 (specifically, a side wall of the first groove 12), so that the sealing assembly 30 is sealedly connected to the middle frame 10.

The cover plate 33 is arranged on the mounting portion 125, so that a cavity is formed between the cover plate 33 and the bottom wall 121 of the first groove 12. The cavity is in communication with the first through hole 14 and the sound outlet holes 11 respectively, thereby forming a front sound cavity of the receiver 21.

Figure 6:
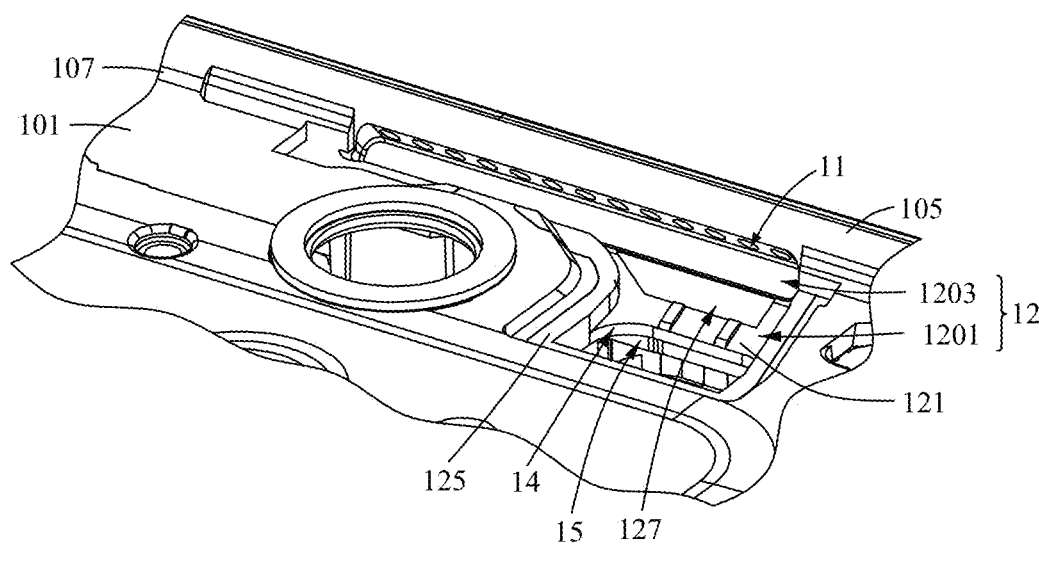
FIG. 6 is a schematic diagram of a middle frame in the terminal device shown in FIG. 1.

Referring to FIG. 6, the first groove 12 includes a first groove portion 1201 and a second groove portion 1203 that are in communication. The first groove portion 1201 is arranged on the first surface 101. The mounting portion 125 is arranged in the first groove portion 1201. The first through hole 14 is in communication with the first groove portion 1201. The second groove portion 1203 is located on a side of the first groove portion 1201 toward the side frame 105, and is located on a junction of the first surface 101 and the side frame 105, so that the second groove portion 1203 is in communication with the plurality of sound outlet holes 11. To adapt to the arrangement of the plurality of sound outlet holes 11 on the side frame 105, the second groove portion 1203 is partially in communication with the first groove portion 1201, and extends toward a side of the first groove portion 1201, so that the first groove 12 is roughly L-shaped.

Figure 7:
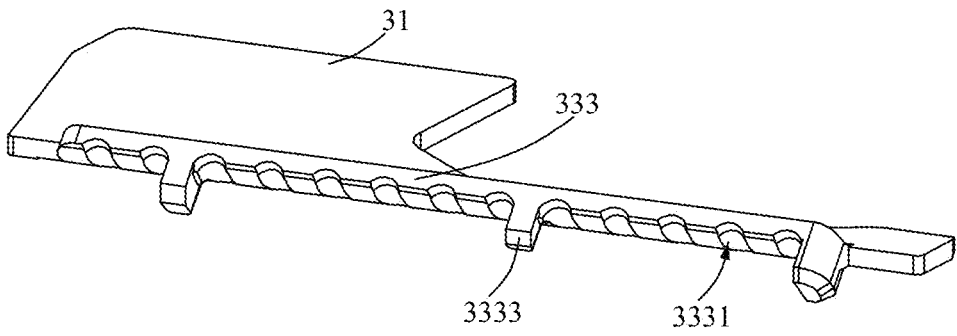
FIG. 7 is a schematic diagram of a cover plate in the terminal device shown in FIG. 1.

Referring to FIG. 7, the cover plate 33 includes a body 331 and an engagement portion 333. The body 331 is arranged on the mounting portion 125. The engagement portion 333 is arranged on a side of the body 331.

Referring to FIG. 5, the body 331 is arranged in the first groove portion 1201, and the engagement portion 333 is arranged in the second groove portion 1203, so that the bottom wall 121 of the first groove 12 and the sound outlet holes 11 are located on a same side of the cover plate 33.

The second sealing member 35 is adhered to the first surface 101 of the middle frame 10, and is adhered to the side frame 105 of the middle frame 10. The second sealing member 35 covers a gap between the cover plate 33 and the first surface 101 and a gap between the cover plate 33 and the side frame 105, so that the sealing assembly 30 is sealedly connected to the middle frame 10.

The second groove portion 1203 extends on the junction of the first surface 101 and the side frame 105 along an arrangement direction of the plurality of sound outlet holes 11, thereby reducing the space occupied by the first groove 12 on the first surface 101, and reducing the impact of the first groove 12 on the structural design layout on the first surface 101 of the middle frame 10.

A side of the cover plate 33 facing away from the first groove 12 is flush with the first surface 101, so that the second sealing member 35 flatly covers the gap between the cover plate 33 and the middle frame 10, and the second sealing member 35 can be adhered to the cover plate 33, thereby increasing the adhesion area of the second sealing member 35, so that the second sealing member 35 stably seals the front sound cavity of the receiver 21.

It may be understood that, in other implementations, one side of the cover plate 33 facing away from the first groove 12 may alternatively be lower or higher than the first surface 101, and a part of the second sealing member 35 corresponding to the cover plate 33 is profiled to the cover plate 33, so that the second sealing member 35 can cover the gap between the cover plate 33 and the middle frame 10.

The second sealing member 35 is adhered to the cover plate 33, thereby increasing the adhesion area of the second sealing member 35, so that the second sealing member 35 stably covers the gap between the cover plate 33 and the middle frame 10. It may be understood that, in other implementations, there may alternatively be no connection between the second sealing member 35 and the cover plate 33. As long as the second sealing member 35 is adhered to the middle frame 10 to stably cover the gap between the cover plate 33 and the middle frame 10, it can be ensured that the sealing assembly 30 is sealedly connected to the middle frame 10.

The first through hole 14 is arranged in the first groove portion 1201 of the first groove 12, to provide a sound channel of the receiver assembly 20. The second groove portion 1203 is in communication with the plurality of sound outlet holes 11, to provide a demolding space for the sound outlet holes 11.

In a possible implementation, the second sealing member 35 is of a mylar structure, but is not limited thereto. For example, in other implementations, the second sealing member 35 may alternatively be of a sealing structure, such as, foam.

In a possible implementation, as shown in FIG. 6, the first surface 101 and the side frame 105 are connected by a rounded transition surface 107. As shown in FIG. 7, the engagement portion 333 is of an arc-shaped structure, so that a side of the engagement portion 333 facing away from the first groove 12 and a surface of the middle frame 10 coincide on the junction of the side frame 105 and the first surface 101. Specifically, when the engagement portion 333 is arranged in the second groove portion 1203, a side of the engagement portion 333 toward the second sealing member 35 is coplanar with the rounded transition surface 107, making it convenient to adhere the second sealing member 35 to the cover plate 33 and the middle frame 10.

It may be understood that, in another possible implementation, the second sealing member 35 may alternatively not be adhered to the first surface 101. For example, another groove (not shown in the figure) is arranged on the middle frame 10, and the another groove is for accommodating the second sealing member 35, so that the second sealing member 35 is adhered to the first surface 101, the rounded transition surface 107, and the side frame 105 respectively, and the second sealing member 35 does not protrude from the first surface 101, thereby reducing the space occupied by the sealing assembly 30 on the first surface 101.

Referring to FIG. 5, the sealing assembly 30 further includes a third sealing member 37. The third sealing member 37 is adhered to the mounting portion 125. The cover plate 33 is arranged on the third sealing member 37. The third sealing member 37 enables the cover plate 33 to be sealedly connected to the mounting portion 125. The third sealing member 37 is roughly of a U-shaped rubber structure. The third sealing member 37 enables the cover plate 33 to be connected in the first groove 12, and achieves preliminary sealing between the cover plate 33 and the middle frame 10. In other embodiments, the third sealing member 37 may alternatively be omitted. The cover plate 33 is coated with glue, and is directly adhered to the mounting portion 125.

In a possible implementation, the first sealing member 23 and the third sealing member 37 are of a foam structure, but are not limited thereto. It may be understood that, in another implementation, the first sealing member 23 and/or the third sealing member 37 may alternatively be of other structures with double-sided glue. Alternatively, in another embodiment, the receiver 21 and the cover plate 33 may be fixed to the middle frame 10 by means other than adhesion. For example, the receiver 21 and the cover plate 33 are locked on the middle frame 10 by fasteners, and a gasket for sealing is arranged between the receiver 21 and the middle frame 10, so that the receiver 21 is sealedly connected to the middle frame 10. The cover plate 33 is sealedly connected to the middle frame 10 by the second sealing member 35.

The engagement portion 333 can avoid the sound outlet holes 11, so that the sound outlet holes 11 are m communication with the first groove 12. In a possible implementation, the engagement portion 333 avoids some of the sound outlet holes 11. To enable the engagement portion 333 to stably avoid all of the sound outlet holes 11, arc-shaped grooves 3331 are arranged on a side of the engagement portion 333 toward the first groove 12, and the arc-shaped grooves 3331 are butted with the sound outlet holes 11.

It may be understood that, in other implementations, the engagement portion 333 with the arc-shaped structure may alternatively avoid all of the sound outlet holes 11. For example, a thickness of the engagement portion 333 is less than a thickness of the body 331. The engagement portion 333 is thinned, so that a contact area between the engagement portion 333 and a groove wall of the second groove portion 1203 is reduced, and the engagement portion 333 does not block the sound outlet holes 11.

Referring to FIG. 5 and FIG. 7 together, support portions 3333 are further arranged on the engagement portion 333 at intervals. The support portions 3333 and the sound outlet holes 11 are staggered. The support portions 3333 are in contact with the middle frame 10. Specifically, the support portions 3333 are in contact with the groove wall of the second groove portion 1203, to improve the strength of the engagement portion 333, so that the arc-shaped engagement portion 333 is not easily deformed by collision, to avoid the problem that the engagement portion 333 blocks the sound outlet holes 11 due to deformation.

Referring to FIG. 5 and FIG. 6 together, to increase the size of the front sound cavity of the receiver 21, a third groove 127 is further arranged on the bottom wall 121 of the first groove 12. In a possible implementation, the third groove 127 is located in the first groove portion 1201, and is in communication with the second groove portion 1203. It may be understood that, in other implementations, the third groove 127 may be arranged in another position on the bottom wall 121 of the first groove 12.

In the foregoing terminal device 100, the first groove 12 of the middle frame 10 and the first through hole 14 form the front sound cavity of the receiver assembly 20. The middle frame 10 is sealedly connected to the receiver assembly 20, and the sealing assembly 30 seals the first groove 12, so that the front sound cavity of the receiver assembly 20 is sealed, and a sound from the receiver assembly 20 is emitted only from the sound outlet holes 11 on the middle frame 10. In this way, the cost of the sealing assembly 30 for sealing the structure of the front sound cavity is low, and the cost of manufacturing the first groove 12 and the first through hole 14 on the middle frame 10 is low.

The foregoing specific embodiments are merely intended for describing the technical solutions of this application but not for limiting this application. Although this application is described in detail with reference to the exemplary implementations, a person of ordinary skill in the art should understand that they may still make modifications or equivalent replacements to the technical solutions described in this application without departing from the spirit and essence of the technical solutions of the embodiments of this application.

What is claimed is:

1. A terminal device, comprising:
a middle frame, comprising:
  a first surface having a first groove arranged thereon, wherein a first through hole is arranged on a bottom wall of the first groove;
  a second surface arranged opposite to the first surface; and
  sound outlet holes arranged on the middle frame, wherein the sound outlet holes are in communication with the first groove;
a receiver assembly arranged on the second surface of the middle frame, wherein the receiver assembly is sealedly connected to the middle frame, and wherein the receiver assembly corresponds to the first through hole;
a third groove arranged on the bottom wall of the first groove; and
a multi-piece sealing assembly arranged on the first surface and at least partially within the first groove, wherein the sealing assembly is configured to seal the first groove, and wherein the sealing assembly comprises:
  a cover plate arranged in the first groove; and
  a second sealing member adhered to the middle frame, wherein the second sealing member covers a gap between the cover plate and the middle frame.

2. The terminal device of claim 1, wherein the receiver assembly comprises:
a receiver; and
a first sealing member having a second through hole, wherein the second through hole is in communication with the first through hole, and
  wherein the second surface of the middle frame includes a second groove arranged thereon, wherein the receiver is arranged in the second groove, and wherein the receiver is sealedly connected to a bottom wall of the second groove by the first sealing member.

3. The terminal device of claim 1, wherein a protruding mounting portion is arranged in the first groove, wherein the sealing assembly further comprises a third sealing member arranged on the protruding mounting portion, and wherein the cover plate is arranged on a side of the third sealing member facing away from the protruding mounting portion.

4. The terminal device of claim 1, wherein the middle frame further comprises a side frame that surrounds outer sides of the first surface and the second surface, and is connected to the first surface and the second surface respectively, wherein the sound outlet holes are arranged on the side frame, wherein the first groove comprises a first groove portion and a second groove portion that are in communication, wherein the first through hole is in communication with the first groove portion, and wherein the second groove portion is located on a junction of the first surface and the side frame, and is in communication with the sound outlet holes.

5. The terminal device of claim 4, wherein the first surface and the side frame are connected by a rounded transition surface, wherein the cover plate comprises an engagement portion with an arc-shaped structure, and wherein the engagement portion is arranged on the second groove portion such that the engagement portion and a surface of the middle frame coincide on the junction of the side frame and the first surface.

6. The terminal device of claim 4, wherein the cover plate comprises a body and an engagement portion, wherein the body is arranged in the first groove portion, and wherein the engagement portion is arranged in the second groove portion such that the bottom wall of the first groove and the sound outlet holes are located on a same side of the cover plate.

7. The terminal device of claim 6, wherein arc-shaped grooves are arranged on the engagement portion, and wherein the arc-shaped grooves are butted with the sound outlet holes.

8. The terminal device of claim 6, wherein protruding support portions are arranged on a side of the engagement portion toward the bottom wall of the first groove, and wherein the support portions are in contact with a groove wall of the second groove portion.

9. The terminal device of claim 2, wherein a front sound cavity comprises the first groove and the first through hole, wherein the front sound cavity is sealed by the sealing assembly, and wherein the receiver is in communication with the sound outlet holes through the second through hole and the front sound cavity.

10. The terminal device of claim 1, wherein a cavity is formed between the cover plate and the bottom wall of the first groove, wherein a front sound cavity comprises the first through hole and the cavity formed between the cover plate and the bottom wall of the first groove, and wherein the second sealing member seals the front sound cavity.

11. The terminal device of claim 1, wherein the second sealing member is made of mylar or foam.

12. The terminal device of claim 3, wherein the cover plate is fixed in the first groove by the third sealing member.

13. The terminal device of claim 3, wherein the third sealing member is U-shaped and made of rubber.

14. The terminal device of claim 3, wherein the cover plate is directly adhered to the protruding mounting portion with glue.

15. The terminal device of claim 4, wherein the second groove portion provides a demolding space for the sound outlet holes and does not occupy a mounting space on the second surface.

16. The terminal device of claim 5, wherein a side of the engagement portion toward the second sealing member is coplanar with the rounded transition surface.

17. The terminal device of claim 7, wherein the engagement portion does not block the sound outlet holes.

18. The terminal device of claim 8, wherein the protruding support portions are staggered with the sound outlet holes and do not block the sound outlet holes.

* * * * *